July 6, 1965 YIGAL YANAI 3,193,707
RADIO FREQUENCY SHIELDED CONTROLLED RECTIFIER
Filed Oct. 16, 1962

RADIO FREQUENCY SHIELDED CONTROLLED RECTIFIER

INVENTOR.
YIGAL YANAI
BY
OSTROLENK, FABER, GERB & SOFFEN
ATTORNEYS

United States Patent Office 3,193,707

Patented July 6, 1965

3,193,707

RADIO FREQUENCY SHIELDED CONTROLLED RECTIFIER

Yigal Yanai, Hollywood, Calif., assignor to International Rectifier Corporation, El Segundo, Calif., a corporation of California Filed Oct. 16, 1962, Ser. No. 230,816

3 Claims. (Cl. 307—88.5)

This invention relates to a novel controlled rectifier construction wherein all radio frequency interference generated by the operation of the rectifier is shielded from the circuit and environment of the rectifier.

Controlled rectifiers are well-known to the art and are used as electrical switching elements in electrical circuits. When acting as a switch, the device will generate "noise" which is mainly in the radio frequency range. This RF interference may be transferred in two ways:

It first appears as radiated interference where the controlled rectifier acts as an antenna generating noise.

It secondly will act to cause interference by conduction through the lead connections of the rectifier to the circuit connected thereto as it generates and conducts transient pulses.

Both of these phenomena are extremely harmful to the circuit which contains the rectifier, and to equipment which is adjacent the rectifier. Thus, the RF interference generated through the circuit can cause premature firing of other controlled rectifiers connected to common supply lines, while the radiated interference is a high level RF noise that can interfere with adjacent systems and circuitry.

The principle of the present invention is to provide a novel controlled rectifier structure which incorporates RF shielding and RF suppression at one and the same element which can further operate to serve as a heat sink for the rectifier. Thus, the complete rectifier can be contained in a large auxiliary conductive housing which itself serves as a radiation shield and a heat sink while various terminals of the rectifier are connected to the shield through passive filter networks which can operate to attenuate RF frequencies in any desired manner, while permitting transfer of certain predetermined frequency bands.

Thus, the network can form a T-type filter network or a $\pi$-type network or could include any combination of filter networks which would essentially act as low pass or band pass filter systems that would not permit conductance of undesirable frequencies.

Accordingly, a primary object of this invention is to suppress undesirable RF components generated by the operation of a controlled rectifier.

Another object of this invention is to provide a novel integrated controlled rectifier assembly which includes passive filter networks and radiation shields to prevent undesired radio frequency transmission.

Another object of this invention is to provide a novel controlled rectifier assembly which includes a conductive shield which serves as both a heat sink and radiation shield wherein passive filter network elements are connected from the shield to the electrodes of the controlled rectifier.

These and other objects of this invention will become apparent from the following description when taken in connection with the drawings, in which.

Figure 1:
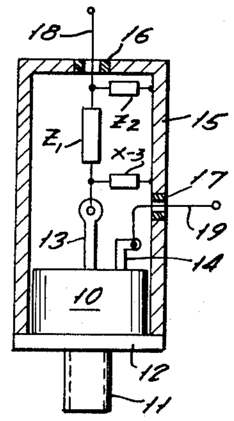
FIGURE 1 shows a side view with the housing partially removed of a rectifier constructed in accordance with the present invention.

Referring now to FIGURE 1, I have illustrated therein a typical controlled rectifier 10 which may be of the type ZN1770 supplied by the International Rectifier Corporation of El Segundo, California, which is provided with an anode stud 11 which is electrically connected to a main conductive housing having the flange 12 wherein a cathode terminal 13 and gate terminal 14 extend through the top of rectifier 10 and in insulated relationship with respect to the rectifier housing.

In accordance with the invention, a conductive tubular shield 15 is secured over the top of rectifier 10 and seats on the upper surface of flange 12. The shield 15 has insulation washers 16 and 17 therein through which leads 18 and 19 connected to cathode 13 and gate 14 respectively may pass in insulated relation with respect to shield 15.

Internally of housing 15 there is provided a $\pi$-type filter network which includes impedances $Z_1$, $Z_2$, and $Z_3$ which are passive network impedances wherein the ends of impedances $Z_2$ and $Z_3$ are connected to shield 15, while $Z_1$ is connected as illustrated.

When the device of FIGURE 1 is connected in an appropriate circuit, it will be apparent that the only radio frequency band that can pass from cathode terminal 18 to anode 11 is that range of frequencies which are permitted by the $\pi$ network. Moreover, the tubular housing 15 serves as a highly efficient shield against radiation from the device 10.

It will be further recognized that the complete controlled rectifier 10 is in good electrical and thermal connection with shield 15 whose mass serves as an additional heat sink to assure cool operation of controlled rectifier 10.

Figure 2:
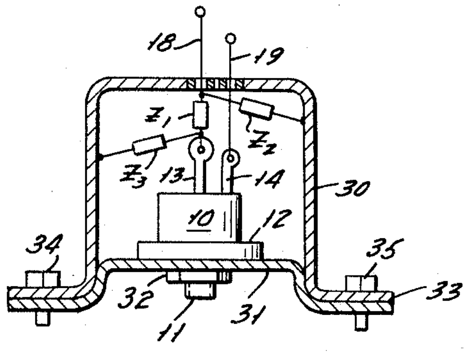
FIGURE 2 is similar to FIGURE 1 and shows a second embodiment of the invention.

A second embodiment of the invention is shown in FIGURE 2 wherein numerals which identify components similar to those of FIGURE 1 have been given similar identifying numerals.

The structure of FIGURE 2 provides a cup-shaped shield 30 which is designed to provide more efficient operation as a heat sink, and includes a lower cup portion 31 having an opening therethrough for receiving stud 11 which has a nut 32 for securing flange 12 directly to cup-shaped portion 31 of the shield.

The shield additionally has an extending flange portion 33 which may have openings therethrough for receiving securing screws 34 and 35 which can secure the complete assembly to an appropriate support base.

Internally of shield 30 there is provided a filter network which again includes filter elements $Z_1$, $Z_2$ and $Z_3$ which are again connected to form a $\pi$-type filter network, as was the case in FIGURE 1.

Figure 3:
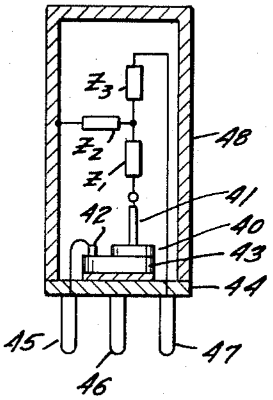
FIGURE 3 is similar to FIGURES 1 and 2, and shows a still further embodiment of the invention.

A third embodiment of the invention is set forth in FIGURE 3 wherein a controlled rectifier 40 having the cathode electrode 41, gate electrode 42, and plate 43, has the plate 43 soldered to conductive base 44 which has extending prongs 45, 46 and 47 which serve as gate anode and cathode terminals respectively which can be received in a tube-type socket.

The base 44 then has a conductive tubular shield 48 secured thereto which serves as an RF shield, and which further contains the impedances $Z_1$, $Z_2$ and $Z_3$ which, in the case of FIGURE 3, form a T-type filter network.

Although this invention has been described with respect to its preferred embodiments, many variations and modifications will now be obvious to those skilled in the art, and it is preferred, therefore, that the scope of this invention be limited not by the specific disclosure herein but only by the appended claims.

What is claimed is:

1. In combination; a silicon controlled rectifier having a plurality of electrodes extending therefrom, a shielding housing of conductive material enclosing said controlled rectifier, and a plurality of impedance elements within said shielding housing electrically connected from said electrodes to said shielding housing to define a filter network; said controlled rectifier having its own respective housing having an anode terminal extending therefrom; said anode terminal and said housing of said controlled rectifier being electrically and thermally connected to said shielding housing.

2. In combination; a silicon controlled rectifier having a housing, a first electrode extending from and connected to said housing, and a second and third electrodes insulated from said housing; a filter network; and a shielding housing; said shielding housing enclosing said controlled rectifier against transmission of radio frequency radiation; said filter network being contained within said shielding housing and preventing transmission of predetermined radio frequency current from said first electrode to one of said second and third electrodes.

3. In combination; a silicon controlled rectifier having a housing, a first electrode extending from and connected to said housing, and a second and third electrodes insulated from said housing; a filter network; and a shielding housing; said shielding housing enclosing said controlled rectifier against transmission of radio frequency radiation; said filter network being contained within said shielding housing and preventing transmission of predetermined radio frequency current from said first electrode to one of said second and third electrodes; said controlled rectifier housing being in thermal contact with said shielding housing.

References Cited by the Examiner

UNITED STATES PATENTS

| | | | |
|---|---|---|---|
| 2,835,874 | 5/58 | First et al. | 174—35 |
| 2,934,588 | 4/60 | Ronci | 174—35.5 |

ARTHUR GAUSS, *Primary Examiner.*